(12) United States Patent
Little et al.

(10) Patent No.: US 7,526,151 B1
(45) Date of Patent: Apr. 28, 2009

(54) HIGHLY SYMMETRIC OPTICAL STRUCTURES

(75) Inventors: Brent E. Little, Glen Head, NY (US); Wei Chen, Ellicott City, MD (US); John V. Hryniewicz, Columbia, MD (US); Wenlu Chen, Catonsville, MD (US); David M. Gill, Pasadena, MD (US); Oliver King, Frederick, MD (US); Roy R. Davidson, Columbia, MD (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 11/778,434

(22) Filed: Jul. 16, 2007

(51) Int. Cl.
G02B 6/12 (2006.01)
(52) U.S. Cl. .................. 385/14; 385/15; 385/39; 385/129
(58) Field of Classification Search ........... 385/14, 385/129, 15, 39
See application file for complete search history.

(56) References Cited

U.S. PATENT DOCUMENTS

| 6,614,977 | B2 | 9/2003 | Johnson et al. | |
|---|---|---|---|---|
| 6,690,025 | B2 | 2/2004 | Won et al. | |
| 6,768,828 | B2 * | 7/2004 | Gill et al. | 385/14 |
| 6,952,514 | B2 * | 10/2005 | Lee et al. | 385/52 |

OTHER PUBLICATIONS

T. Wang, M. Jalal Khan, J. Viens, M. Lim, D. Fried, J. Foresi, G. Ulu, and A. Agarwal, "Cross-Polarization Generation and Its Impact on Coupler Performance," *IEEE Journal of Selected Topics in Quantum Electronics*, vol. 12, No. 4, Jul./Aug. 2006, pp. 751-759.

G. A. Porkolab, Shih-Hsiang Hsu, J. V. Hryniewicz, W. Lin, Y. J. Chen, S. Agarwala, F. G. Johnson, Oliver King, M. Dagenals, and D. R. Stone, "Etch-mask of pyrolytic-photoresist thin-film for self-aligned fabrication of smooth and deep faceted three-dimensional microstructures," *J. Vac. Sci. Technol. B 14(6) Nov./Dec. 1996, American Vacuum Society*, pp. 3650-3653.

G.A. Porkolab, Y. J. Chen, S. A. Tabatabaei, S. Agarwala, F.G. Johnson, O. King, M. Dagenals, R. E. Frizzell, W. T. Beard, Jr., and D. R. Stone, "Air-bridges, air-ramps, planarization, and encapsulation using pyrolytic photoresist in fabrication of three-dimensional microstructures," *J. Vac. Sci. Technol. B 15(6), Nov./Dec. 1997, American Vacuum Society*, pp. 1961-1965.

T. A. Brunner, "Impact of lens aberrations on optical lithography," *IBM J. Res. Develop*, vol. 41, No. 1 and 2, Jan./Mar. 1997, pp. 57-67.

C. R. Doerr, L. L. Buhl, and W. Lin, "Simple Method for Mitigation of Polarization Crosstalk in Silica Planar Lightwave Circuit Directional Couplers," *IEEE Photonics Technology Letters*, vol. 18, No. 17, Sep. 1, 2006, pp. 1816-1818.

\* cited by examiner

*Primary Examiner*—Jennifer Doan
(74) *Attorney, Agent, or Firm*—W. Douglas Carothers, Jr.; David L. Soltz

(57) ABSTRACT

An intermediate structure used to form an integrated optics device comprising a substrate, a cladding on the substrate, at least one real waveguide on the cladding, and at least one dummy waveguide optically coupled with the real waveguide. The real waveguide forms a part of a predetermined planar lightwave circuit. The dummy waveguide does not form a part of the predetermined planar lightwave circuit.

13 Claims, 7 Drawing Sheets

HIGHLY SYMMETRIC OPTICAL STRUCTURES

CROSS-REFERENCE TO RELATED APPLICATIONS

Not Applicable.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

REFERENCE TO A "SEQUENCE LISTING," A TABLE, OR A COMPUTER PROGRAM LISTING APPENDIX SUBMITTED ON A COMPACT DISC AND AN INCORPORATION-BY-REFERENCE OF THE MATERIAL ON THE COMPACT DISC (SEE § 1.52(E)(5))

Not Applicable.

BACKGROUND OF THE INVENTION

A significant class of optical devices are commonly called "planar light-wave circuits" or "planar light-wave chips" or just PLCs. PLCs comprise technologies wherein optical components and networks are disposed monolithically within a stack or stacks of optical thin films supported by a common mechanical substrate such as a semiconductor or glass wafer. PLCs are typically designed to provide specific transport or routing functions for use within fiber-optic communications networks. These networks are distributed over a multitude of geographically dispersed terminations and commonly include transport between terminations via single-mode optical fiber. For a device in such a network to provide transparent management of the optical signals it must maintain the single-mode nature of the optical signal. As such, the PLCs are commonly, though not strictly, based on configurations of single-mode waveguides. Since optical signals do not require return paths, these waveguide configurations do not typically conform to the classic definition of "circuits", but due to their physical and functional resemblance to electronic circuits, the waveguide systems are also often referred to as circuits.

The standard family of materials for PLCs, widely demonstrated to have superior loss characteristics, is based on silicon dioxide, commonly called silica. The silica stack includes layers that may be pure silica as well as layers that may be doped with other elements such as Boron, Phosphorous, Germanium, or other elements or materials. The doping permits control of index-of-refraction and other necessary physical properties of the layers. Silica, including doped silica, as well as a few less commonly used oxides of other elements, are commonly also referred to collectively as "oxides." Furthermore, although technically the term "glass" refers to a state of matter that can be achieved by a broad spectrum of materials, it is common for "glass" to be taken to mean a clear, non crystalline material, typically $SiO_2$ based. It is therefore also common to hear of oxide waveguides being referred to as "glass" waveguides. Subsequently, the moniker "silica" is used to refer to those silicon oxide materials suitable for making waveguides or other integrated photonic devices. It is important to note that in the context of this invention, other waveguide materials, such as lithium niobate, spin-on glasses, silicon, siliconoxynitride, silicon oxycarbide, polymers, group "III-V" materials such as InP, GaAs, and InGaAsP or other materials described in U.S. Pat. No. 6,614,977 (the entire content of which is hereby incorporated herein by reference), are also appropriate.

In a typical example of a PLC, a waveguide formed of a core material lies between a top cladding layer and a bottom cladding layer. In some instances, a top cladding may not be used. Waveguides are often formed by at least partially removing (typically with an etching process) core material beyond the transverse limits of the channel waveguide and replacing it with at least one layer of side cladding material that has an index of refraction that is lower than that of the core material. The side cladding material is usually the same material as the top cladding material. In this example, each layer is doped in a manner such that the waveguide has a higher index of refraction than either the top cladding or bottom cladding. When layers of silica glass are used for the waveguide, the layers are typically situated on a silicon wafer. As a second example, waveguides can comprise three or more layers of InGaAsP. In this example, adjacent layers have compositions with different percentages of the constituent elements In, P, Ga, and As. As a third example, one or more of the optical layers of the waveguide may comprise an optically transparent polymer. Another example of a waveguide comprises a layer with a graded index such that the region of highest index of refraction is bounded by regions of lower indices of refraction.

Many integrated optical devices require the creation of physical structures that are highly symmetric. A key example is a planar waveguide coupler consisting of two optical waveguides coupled to each other across a gap. In many cases, the achievement of highest performance in such a coupler requires the two waveguides to be identical to each other. A conventional approach to achieving this goal is to define the optical waveguides using a photolithography and etching process with a pattern consisting of two waveguides of identical cross section separated by a gap. In this scheme, the fabrication of identical guides relies upon very high fidelity in the lithography and etching processes to reproduce the identical mask patterns into the optical waveguides. This strategy will allow integrated optical couplers to be fabricated with a certain level of performance that may be adequate for some types of devices. However, the ultimate performance may be limited due to asymmetries induced by the fabrication process.

One structure that may be used to evaluate the performance of coupler structures is a beat-length coupler. Such a coupler consists of two optical waveguides that are brought into close proximity to each other and optically couple such that at a certain wavelength and polarization the optical power should be completely transferred from one guide ("bar") to the other ("cross"). The ratio of the optical power in the bar output waveguide to the power in the cross output waveguide can be defined as an "extinction ratio". This may be expressed in log scale as $ER=10\times\log(Pbar/Pcross)$ decibels (dB). A high quality beat-length coupler test structure will have an extinction ratio that is a negative number of large magnitude at its optimal wavelength and polarization ("high extinction ratio"). The performance of a beat-length coupler test structure provides an indication of the performance of other couplers that have the same design parameters except for length. We have found that using the straightforward conventional approach it is difficult to achieve consistent extinction ratios below −20 dB in high index contrast planar lightwave circuits (PLCs). A high index contrast planar lightwave circuit typically has a core to cladding refractive index greater than 0.03.

The extinction ratio of an integrated optical coupler, for example, can be degraded by asymmetries introduced in the fabrication process. The present invention greatly reduces a critical type of fabrication-induced asymmetry.

The outline of a process to produce PLCs of integrated optical waveguides is as follows:

a. Grow a higher index waveguide core layer on a lower index cladding layer on a carrier substrate wafer b. Spin photoresist on the waveguide core layer, expose using a suitable pattern, develop the photoresist c. Etch the waveguide core layer using the photoresist pattern as a resistant etch mask d. Remove the remaining resist mask and deposit lower index cladding material on the wafer The photolithography step is fundamental to creating a device with a physical pattern that closely resembles the intended design. Integrated optics technology makes use of a number of sophisticated technologies devised for the semiconductor industry. A key such technology is exposure of patterns using a projection stepper. A stepper illuminates a patterned photomask reticle with ultraviolet light and projects a focused image onto the photoresist layer surface using a precision multi-element lens system. The pattern of ultraviolet light intensity at the photoresist layer ("aerial image") exposes the photoresist, causing chemical changes that will allow a detailed pattern remain on the wafer surface after a chemical development process. Ideally, if a symmetric pattern exists on the photomask reticle, it should produce a symmetric aerial image, and therefore a symmetric photoresist pattern. However, it is possible for the stepper imaging lens system to induce distortions that result in the production of an asymmetric aerial image from a symmetric pattern on the reticle.

It is well known that any real lens has imperfections that result from limitations in the lens design or residual imperfections from manufacture. For example, shown in FIG. 1 is a stepper distortion field vector map illustrating stepper lens distortion due to aberrations in an exemplary stepper imaging lens system.

One manifestation of these imperfections is a displacement of the location of a pattern on the wafer surface from its ideal intended location. It is possible to observe the variation of these displacements across the field of the lens by using a special test reticle and position measuring apparatus on the interferometer controlled motion stage of the stepper. An example of such a distortion map is included here as FIG. 1. These distortions are caused by aberrations of the lens. The manufacturer of the stepper lens has attempted to correct these aberrations to a great degree through design and control of the shapes and compositions of the lens elements, but there are always some uncorrected aberrations left in each lens. The effects of these residual aberrations can vary across the field of the lens.

An example of a well-known type of lens aberration is coma. In coma, optical rays away from the axis of an imaging system are improperly focused and shifted from their desired focal position. Although primary coma aberration is typically targeted for correction by a stepper lens maker, it is likely that some residual coma-like aberrations remain. Although the primary effect of coma is to cause an image shift, it has been shown that it can also cause a localized asymmetry in an aerial and resist image (T. A. Brunner, IBM J. of Research and Development, Vol. 41 No. 1/2, January/March 1997, pp. 57-67, see page 62, http://www.research.ibm.com/journal/rd/411/brunner.pdf). We have simulated the projection of a conventional coupler image using typical parameters for our stepper. Simulation shows that moderate degrees of coma can create aerial images of waveguide couplers that have asymmetries of the order of 13 nm. Optical device simulation (figure included) shows that for our high index contrast couplers the beat-length coupler extinction ratio would be limited to −20 dB. This is in close agreement with results observed using couplers made without the benefit of the present invention. It should be noted that as the uncorrected aberrations vary across the lens field, the asymmetries induced in couplers due to this effect are expected to vary across the field. This would cause coupler extinction to vary depending on the location of a coupler on a photomask reticle. We have observed this effect experimentally.

In addition, asymmetry may be due to other steps in the process of fabricating a planar lightwave circuit, such as the step of etching. Etching is a chemical process that can be quite pattern dependent. For example, in a coupled waveguide system, the etching rate in the gap side of the waveguide is different than the etching on the outside of the waveguide. This leads to waveguides that have a "profile asymmetry". Profile asymmetry is where a waveguide is not perfectly symmetric like a rectangle or a trapezoid. One side of the waveguide may be perfectly vertical, while the other side may be tilted. It is known that such profile asymmetry causes degradation of couplers.

Therefore, there is a need for a device and method to enhance the symmetry of waveguides used in PLCs of integrated optical devices. It is to such devices and methods that the present invention is directed.

BRIEF SUMMARY OF THE INVENTION

In one version, the present invention is directed to an intermediate structure used to form an integrated optics device. The intermediate structure is provided with a substrate, a cladding on the substrate, at least one real waveguide, and at least one dummy waveguide. In this version, the at least one real waveguide is on the cladding and the real waveguide forms a part of a predetermined planar lightwave circuit. The at least one dummy waveguide is optically coupled with the real waveguide but does not form a part of the predetermined planar lightwave circuit.

In another version, the present invention is an intermediate structure used to form an integrated optics device, comprising a substrate, a cladding on the substrate, a plurality of real waveguides and a plurality of dummy waveguides. The real waveguides are on the cladding and form a planar lightwave circuit. The dummy waveguides are positioned in close proximity to the real waveguides so as to optically couple with the real waveguides upon introduction of light into one or more of the real waveguides, the dummy waveguides cooperate with the real waveguides to form periodic repeating structures.

In yet another version, the present invention is an intermediate structure used to form an integrated optics device. The intermediate structure comprises a substrate, a cladding on the substrate, at least one real waveguide, a first subset of dummy waveguides and a second subset of dummy waveguides. The at least one real waveguide is on the cladding and forms a part of a planar lightwave circuit. The at least one real waveguide forms a pattern of interest having a first side and a second side. The first subset of dummy waveguides extends adjacent to the first side of the pattern of interest of the real waveguide, at least one of the dummy waveguides in the first subset is optically coupled with the real waveguide. The second subset of dummy waveguides extends adjacent to the second side of the pattern of interest, at least one of the dummy waveguides in the second subset is optically coupled with the real waveguide.

In yet another version, the intermediate structure includes two spaced apart optically coupled real waveguides forming the pattern of interest. The dummy waveguides in the first and second subsets are spaced apart a distance about equal to the spacing between the optically coupled real waveguides. The dummy waveguides in the first and second subsets can have a width which is about the same as a width of one of the real waveguides.

In another version, the present invention is directed to a photomask used in the production of integrated optical devices. The photomask is provided with a translucent plate having an image formed thereon for transfer to a photoresist layer on a wafer. The image has indicia in a predetermined pattern indicative of at least one real waveguide and at least one dummy waveguide where upon formation of the real waveguide and the dummy waveguide on the wafer, the real waveguide is optically coupled with the dummy waveguide. The photomask can be a positive photomask or a negative photomask. Thus, the real and dummy waveguides can either be determined by the indica forming opaque regions in the shape of the real and dummy waveguides (positive photomask), or by the indicia forming translucent regions in the shape of the real and dummy waveguides (negative photomask).

In yet another version, the indicia indicative of the real waveguide is a part of indicia forming a predetermined planar lightwave circuit, and the indicia of the dummy waveguide is not a part of the predetermined planar lightwave circuit.

In yet another version, the present invention is directed to a photomask system used in the production of integrated optical devices. The photomask system includes a first photomask and a second photomask. The first photomask comprises a translucent plate having an image formed thereon for transfer to a photoresist layer on a wafer. The image has indicia in a predetermined pattern indicative of at least one real waveguide and at least one dummy waveguide where upon formation of the real waveguide and the dummy waveguide on the wafer the real waveguide is optically coupled with the dummy waveguide. The second photomask comprises a translucent plate having an image formed thereon for transfer to a photoresist layer on the wafer. The image on the translucent plate of the second photomask has indicia that, upon alignment of the first and second photomasks, overlaps and covers the indicia of the real waveguides on the first photomask.

The first and second photomasks can be positive photomasks, negative photomasks or a combination thereof. Thus, the real and dummy waveguides can either be determined by the indica forming opaque regions in the shape of the real and dummy waveguides (positive photomask), or by the indicia forming translucent regions in the shape of the real and dummy waveguides (negative photomask).

In yet another version, the present invention is directed to a method for fabricating a planar lightwave circuit of an integrated optical device. The method comprises the steps of forming a core material with real and dummy waveguides where the real waveguides are part of a planar lightwave circuit and the dummy waveguides are not a part of the planar lightwave circuit and with the real waveguides optically coupled with at least some of the dummy waveguides; and modifying at least one dummy waveguide adjacent to a real waveguide to prevent the at least one dummy waveguide from optically coupling with the real waveguide upon light being introduced into the real waveguide.

The core material can be formed by transferring electromagnetic energy through a translucent plate of a first photomask onto a first photoresist layer on the core material. The first photomask has an image of indicia in a predetermined pattern indicative of at least one real waveguide and at least one dummy waveguide. Then, the first photoresist layer is developed to form a mask having the predetermined pattern of the real waveguides and the dummy waveguides. The predetermined pattern of the real waveguides and dummy waveguides can then be transferred into the core material to form real and dummy waveguides. The dummy and real waveguides optically couple upon light being introduced into one of the real waveguides.

The at least one dummy waveguide can be modified by depositing a second photoresist layer on the core material containing the dummy and real waveguides, and transferring electromagnetic energy through a translucent plate of a second photomask onto the second photoresist layer on the core material. The second photomask has an image of indicia in a predetermined pattern overlapping and covering the real waveguides. The photoresist layer is developed to form a mask exposing the dummy waveguides; and then the predetermined pattern is transferred into the wafer to remove at least a portion of the dummy waveguides. The mask can also cover the real waveguides.

In yet another version, the present invention is directed to a method for fabricating a planar lightwave circuit of an integrated optical device. In this method, an image is formed in a photoresist layer on a core material constructed of optically transparent material. The image has a predetermined pattern indicative of at least one real waveguide and at least one dummy waveguide. The at least one dummy waveguide is removed from the image in the photoresist layer and then the photoresist layer is developed to form a mask having the predetermined pattern of the real waveguides. The predetermined pattern of the real waveguides is transferred into the core material to form real waveguides.

BRIEF DESCRIPTION OF THE SEVERAL VIEWS OF THE DRAWING

So that the above recited features of the present invention can be understood in detail, a more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

FIG. 5 is a fragmental top plan view of an exemplary first photomask constructed in accordance with the present invention and usable in the photolithography system depicted in FIG. 2; and FIG. 6 is a fragmental top plan view of an exemplary second photomask constructed in accordance with the present invention and usable in the photolithography system depicted in FIG. 2.

FIG. 9 is a fragmental top plan view of another version of a first photomask constructed in accordance with the present invention and usable in the photolithography system depicted in FIG. 2; and FIG. 10 is a fragmental top plan view of another version of a second photomask constructed in accordance with the present invention and usable in the photolithography system depicted in FIG. 2.

FIG. 11 is a fragmental top plan view of an exemplary first photomask constructed in accordance with the present invention and usable in the photolithography system depicted in FIG. 2; and FIG. 12 is a fragmental top plan view of an exemplary second photomask constructed in accordance with the present invention and usable in the photolithography system depicted in FIG. 2.

DETAILED DESCRIPTION OF THE INVENTION

Figure 1:
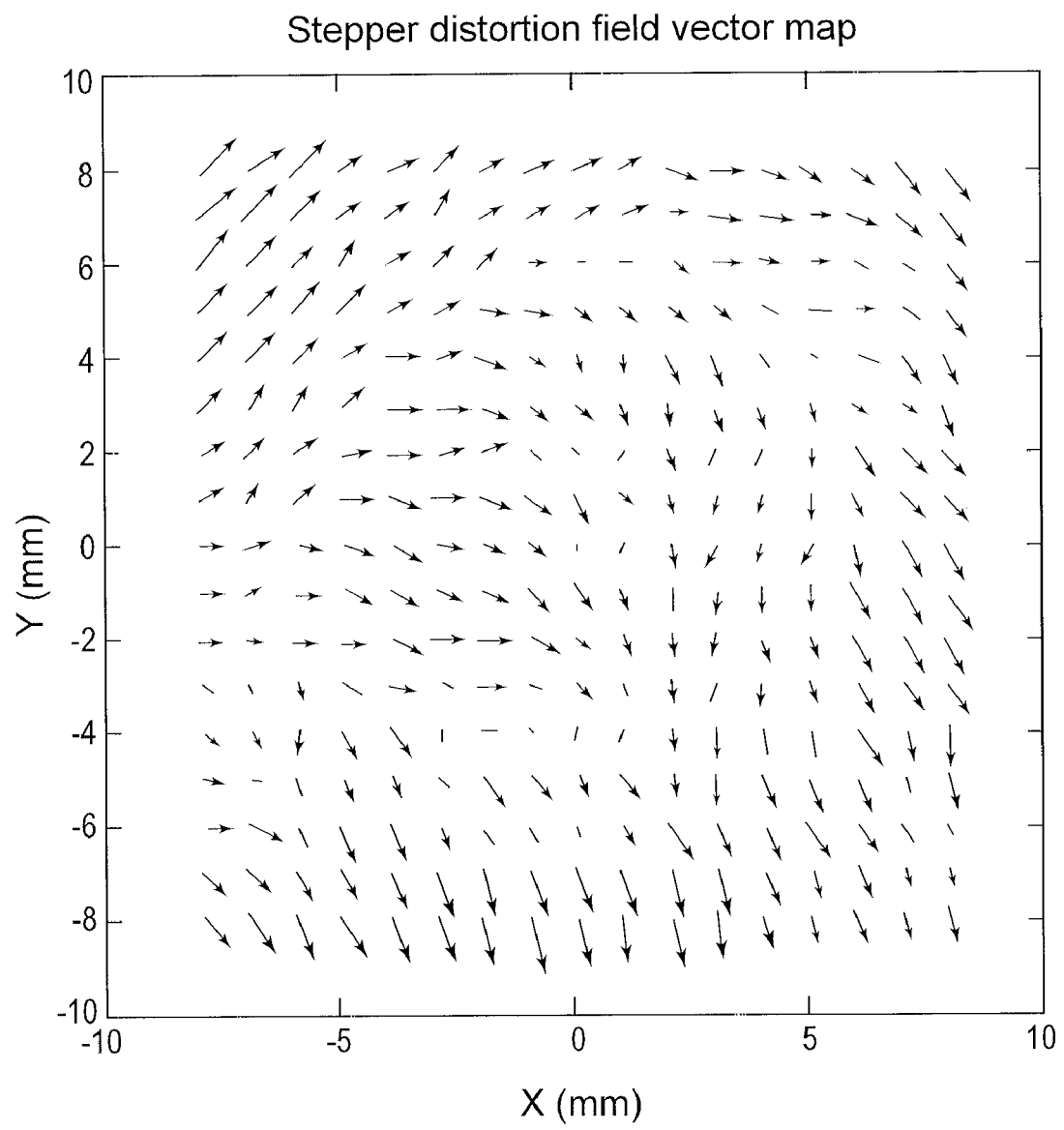
FIG. 1 is a stepper distortion field vector map illustrating stepper lens distortion due to aberrations in an exemplary stepper imaging lens system.

Presently preferred embodiments of the invention are shown in the above-identified figures and described in detail below. In describing the preferred embodiments, like or identical reference numerals are used to identify common or similar elements. The figures are not necessarily to scale and certain features and certain views of the figures may be shown exaggerated in scale or in schematic in the interest of clarity and conciseness.

Definitions

"Pattern of interest" is a part of a component or a planar light-wave circuit formed of at least one real waveguide where it is desired to improve the symmetry of the at least one waveguide. The pattern of interest typically has a first side and a second side.

"Real waveguide" is a waveguide forming a part of a component or a planar lightwave circuit.

"Dummy waveguide" is a waveguide not forming a part of the component or planar lightwave circuit.

"Planar light-wave circuits" or "PLCs" comprise technologies wherein optical components and networks are disposed monolithically within a stack or stacks of optical thin films supported by a common mechanical substrate such as a semiconductor or glass wafer. Some examples of PLCs used with this invention include arrayed waveguide gratings, variable optical attenuators, optical add/drop multiplexers, dynamic dispersion compensators, dynamic gain equalization filters, optical power splitters, optical couplers, optical shutters, optical switches, and optical taps.

"Optical component" or "component" means an optical device that can be combined with one or more other optical devices to form a planar light-wave circuit. Examples of an optical component include a coupler, a resonator, a waveguide, a circulator, a splitter, a combiner, a rotator, a variable optical attenuator (VOAs), a Mach-Zehnder (MZs), a half-band filter, and a grating.

Description

Figure 2:
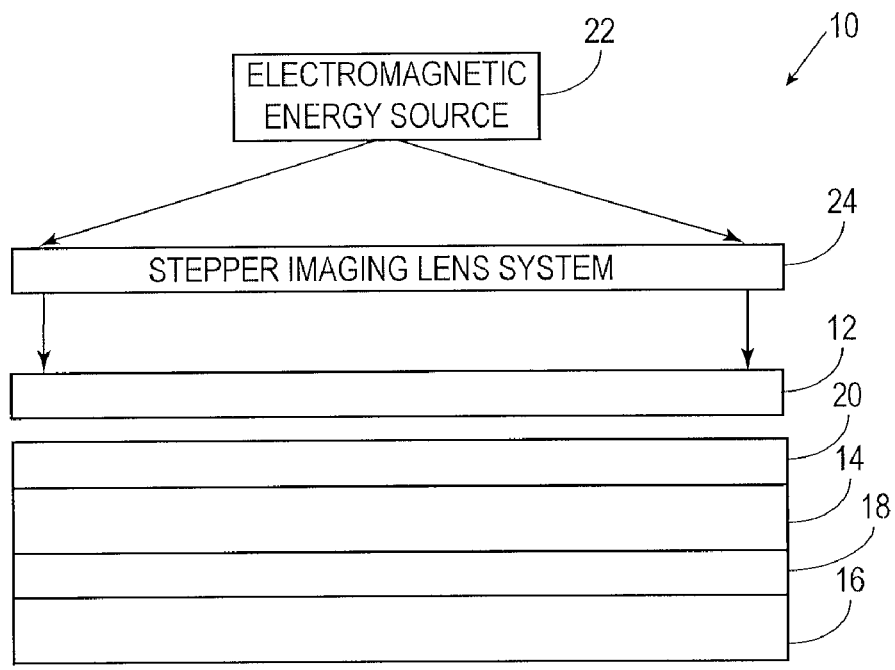
FIG. 2 is a diagrammatic view of an exemplary photolithography system for transferring patterns on a photomask to a thin film optical material on a substrate in accordance with the present invention.

Referring now to the drawings and in particular to FIG. 2, shown therein and designated by a reference numeral 10 is an exemplary photolithography system for transferring patterns on a photomask 12 to a core material 14 on a substrate 16 in accordance with the present invention. In one embodiment, the core material 14 is a thin film constructed of a material selected from a group consisting of silicon, silicon nitride, silicon oxynitride, silicon oxycarbide, germanium doped silica, Indium Phosphide, Gallium Arsenide, high index polymers, and combinations thereof. The core material 14 is deposited on a cladding material 18 constructed of a material having an index of refraction that is lower than the index of refraction of the core material 14. The cladding material 18 can be selected from a group consisting of silica, lower index silicon oxynitride, lower index silicon oxycarbide, Indium Galium Arsenide Phosphide, polymers, and combinations thereof. Various examples of combinations of thin film optical materials and claddings suitable (and methods of making same) for forming the core material 14 and cladding material 18 are discussed in U.S. Pat. No. 6,614,977, the entire content of which is hereby incorporated herein by reference.

A photoresist layer 20 is disposed on the core material 14. In general, the photoresist layer 20 is constructed of a material that prevents material beneath the photoresist layer 20 from being removed or material directly underneath the photoresist layer 20 to be removed during a subsequent process for removing predetermined parts of the core material 14, such as an etching process. Thus, the photoresist layer 20 can be either a positive photoresist or a negative photoresist. The present invention will be described herein by way of example as the photoresist layer 20 being a positive photoresist. The photoresist layer 20 can be provided on the core material 14 utilizing any suitable process, such as spin coating.

The photolithography system 10 is also provided with an electromagnetic energy source 22 directing energy through a stepper imaging lens system 24 and the photomask 12 to the photoresist layer 20. The electromagnetic energy source 22 provides electromagnetic energy capable of reacting with the photoresist layer 20 to transfer the pattern on the photomask 12 to the photoresist layer 20. In one embodiment, the electromagnetic energy source 22 can be a high intensity ultraviolet light source, and x-ray source, an e-beam source, or a laser.

Figure 3:
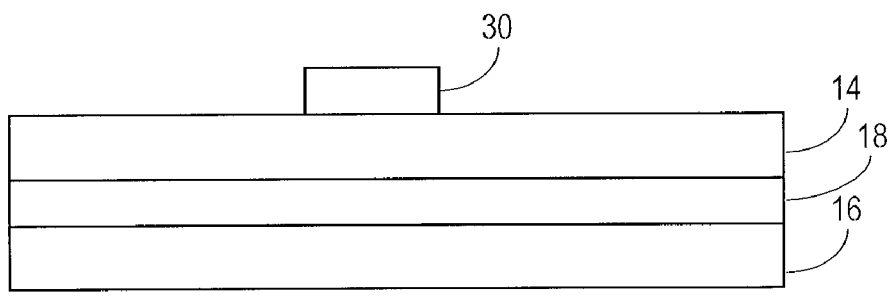
FIG. 3 is a diagrammatic view of an exemplary positive mask formed on the thin film optical material utilizing the photolithography system of FIG. 2.

The stepper imaging lens system 24 receives the electromagnetic energy from the electromagnetic energy source 22 and directs such energy to the photomask 12 which exposes parts of the photoresist layer 20 to the electromagnetic energy. Such exposure can be by any suitable method, such as contact, proximity, and projection Once the photoresist layer 20 has been exposed, then such photoresist layer 20 is developed to form a mask 30 as shown in FIG. 3. For simplicity of illustration, the mask 30 is shown to have a simple geometry. However, it should be understood that the mask 30 may have a more complex layout/geometry as described below.

Figure 4:
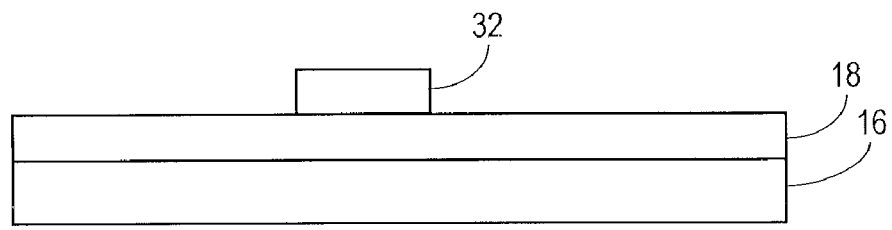
FIG. 4 is a diagrammatic view of a waveguide formed from the thin film optical material using the mask depicted in FIG. 3.

Once the mask 30 is formed, then the pattern formed by the mask 30 is transferred into the core material 14 to form an optical waveguide 32 as shown in FIG. 4. The transferring can be accomplished by any suitable process, such as an etching process. It should be understood that the optical waveguides 32 forming the PLCs referred to herein may be formed using standard or later developed techniques used in the semiconductor industry to deposit and pattern optical waveguide materials, e.g., dry-etch, wet-etch, flame hydrolysis deposition (FHD), chemical vapor deposition (CVD), reactive ion etching (RIE), physically enhanced CVD (PECVD), or the like. Once the waveguide 32 is formed, the mask 30 is removed, and another layer of cladding material (not shown) can then be deposited over the entire surface and planarized if necessary utilizing any suitable process. For example, a process for applying another layer of cladding material is discussed in U.S. Pat. No. 6,768,828 entitled "Integrated Optical Circuit With Dense Planarized Cladding Layer"; the entire content of which is hereby expressly incorporated herein by reference.

While the above methods for fabricating the optical waveguide 32 of the present invention are described above in terms of fabricating one waveguide 32, it should be apparent to those skilled in the art that such fabrication methods, as well as any other appropriate fabrication techniques currently known in the art or later developed, can be utilized to fabricate one or more of the waveguide(s) 32, or portions thereof, such as when one or more waveguide structures are included on a chip, or on a wafer (e.g., a silicon wafer) having a plurality of chips.

The background section above demonstrates that the image of a pair of otherwise symmetric isolated waveguides can become asymmetric under the influence of process aberration. Two previously identical features on a photomask become no longer identical when transferred to a thin film on a substrate. As will be discussed below, in accordance with the present invention additional indicia and spaces are added to the pattern on a first photomask adjacent to the patterns of interest. The most straightforward implementation is to add indicia of dummy waveguides of the same width and spacing as the patterns of interest, on both sides. The resulting pattern begins to resemble a grating, rather than an isolated pair of lines. Such a repeating pattern has a high degree of translational symmetry. The central portion of this "grating" should be relatively immune to aberration-linked asymmetry, with asymmetries pushed out to the edges of the "grating" where the translational symmetry no longer holds. The aberration is caused by an image of one waveguide affecting the image of another waveguide. But if everything appears periodic then the waveguides near the center of the periodic structure appear more symmetric.

The pattern suggested above shows promise to reduce asymmetry, but has a drawback when applied to optical waveguides. To have good effect, the added adjacent structures (i.e., dummy waveguides) must be in close proximity, e.g., approximately 0.5 microns, to the real waveguides of interest. If they are too far away, they will have limited effect on the exposed ultraviolet aerial image. However, these adjacent structures will function as actual optical waveguides and will couple optically to the real waveguides. It may be possible to include such dummy waveguides in the overall component or circuit design, or to minimize their optical impact, but it would be desirable for these symmetrizing structures (i.e., dummy waveguides) to be eliminated from the device once their role in reducing assymetry caused by transfer of the image from the first photomask to the photoresist is over. For this purpose, certain embodiments of the present invention utilize additional processing with a second photomask to modify the dummy waveguides to reduce or even eliminate coupling with the real waveguides.

Figure 5:
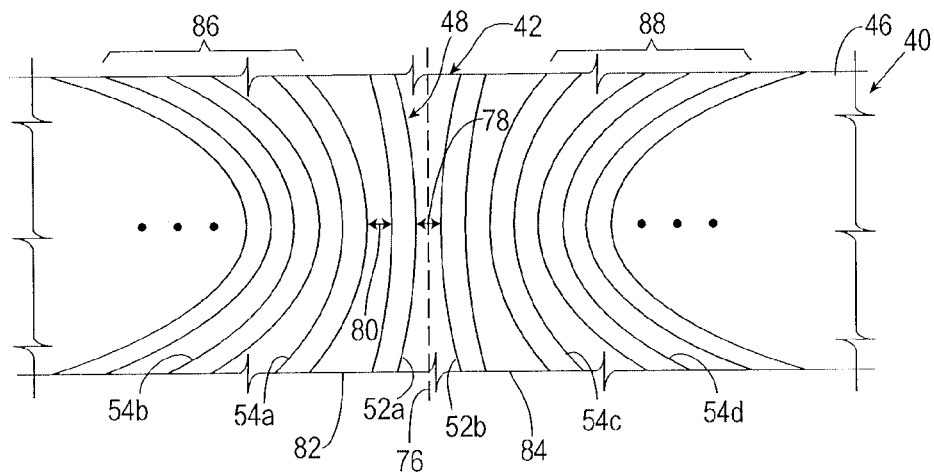
FIGS. 5 and 6 cooperate to illustrate a photomask system used in the production of integrated optical devices in accordance with the present invention. In particular.
Figure 6:
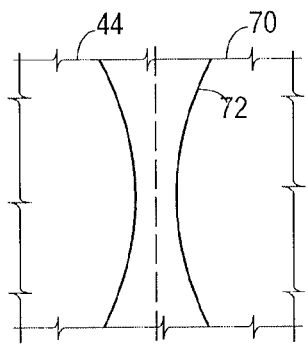

FIGS. 5 and 6 cooperate to illustrate a photomask system 40 used in the production of integrated optical devices in accordance with the present invention. In particular, FIG. 5 is a fragmental top plan view of an exemplary first photomask 42 constructed in accordance with the present invention and usable in the photolithography system 10 depicted in FIG. 2.

FIG. 6 is a fragmental top planview of an exemplary second photomask 44 constructed in accordance with the present invention and also usable in the photolithography system 10 depicted in FIG. 2.

The first photomask 42 is provided with a translucent plate 46 having an image 48 formed thereon for transfer to the photoresist layer 20 on the cladding 18 of the substrate 16. The image 48 is provided with indicia 50 in a predetermined pattern indicative of at least one real waveguide 52 and at least one dummy waveguide 54. By way of example, the indicia 50 is indicative of a component known as a "coupler" formed by two real waveguides designated by reference numerals 52a and 52b. Also by way of example, indicia 50 of four dummy waveguides 54a, 55b, 54c and 54d are depicted in FIG. 5. The indicia 50 of the real waveguide's 52a and 52b and the indicia 50 of the dummy waveguides 54a, 54b, 54c and 54d are positioned such that upon formation of real waveguides 60 (depicted in FIG. 7a) and dummy waveguides 62 (also depicted in FIG. 7a) on the cladding 18, the real waveguides 60 are optically coupled with the dummy waveguides 62. For purposes of clarity, the real waveguides are designated by the reference numerals 60a and 60b, and the dummy waveguides are designated by the reference numerals 62a, 62b, 62c, and 62d. It should be understood that more or less of the dummy waveguides 62 and real waveguides 60 can be formed in accordance with the present invention.

Thus, additional indicia 50 is provided in the image 48 on the first photomask 42 for transferring an image of dummy waveguides 54 onto the photoresist layer 20 that are not a part of the planar light circuits. Preferably, the additional indicia 50 do not intersect the indicia 50 of the real waveguides 52 and the indicia 50 of the dummy waveguide 54 adjacent to the indicia 50 of the real waveguide 52 is preferably spaced such that at any point along the indicia 50 of the dummy waveguide 54, the gap between the indicia 50 of the dummy waveguide 54 and the real waveguide 52 (and between the indicia 50 of two dummy waveguides 54), should be identical to the gap between the indicia 50 of the real wave guides 52.

The second photomask 44 is provided with a translucent plate 70 having an image 72 formed thereon. As will be discussed in more detail below with reference to FIGS. 13 and 14, the image 72 is designed so as to modify certain of the dummy waveguides 62a-d which are formed utilizing the first photomask 42. In either case, the image 42 is provided in the shape of the real waveguides 52a and 52b so as to protect the pattern of interest, i.e. the real waveguides 52 forming a component or a planar lightwave circuit from a subsequent operation removing or modifying the dummy waveguides 62a-d in the formation of the integrated device. In one embodiment, the image 72 on the translucent plate 70 of the second photomask 44 has indicia 72 that, upon alignment of the first and second photomasks 42 and 44, overlaps and covers the indicia 50 of the real waveguides 52a and 52b on the first photomask 42.

The first and second photomasks 42 and 44 can be positive photomasks, negative photomasks or a combination thereof. Thus, the real and dummy waveguides 52 and 54 can either be determined by the indicia 50 and 72 forming opaque regions in the shape of the real and dummy waveguides 52 and 54 (positive photomask), or by the indicia 50 and 72 forming translucent regions in the shape of the real and dummy waveguides 52 and 54 (negative photomask).

Referring again to FIG. 5, the indicia 50 forming the dummy waveguides 54 is preferably designed to form periodic repeating structures so as to emulate an optical diffraction grating. In this regard, it should be noted that the first photomask 42 is provided with an axis 76 bisecting the optical component formed by the real waveguides 52a and 52b into symmetric parts. The indicia 50 of the real waveguides 52a and 52b passes in close proximity to one another forming a gap 78 there between. The gap 78 can be any suitable spacing, such as 100 nm to 5 um. In one embodiment, the gap 78 is about 0.5 micron. In one embodiment, the indicia 50 forming the dummy waveguides 54a, 54b, 54c and 54d is sized to correspond to the same size as the real waveguides 50a and 50b, and are preferably spaced apart a same distance as the gap 78 to form a symmetric, periodic repeating structure about the optical component formed by the real waveguides 52a and 52b.

The component depicted by the indicia 50 in FIG. 5, can be further characterized as having a first side 82, and a second side 84. The first side 82 is coincident with an outer edge of the indicia 50 forming the real waveguide 52a, while the second side 84 is coincident with an outer edge of the indicia 50 forming the real waveguide 52b.

The indicia 50 of the dummy waveguides 54a-d can be divided into a plurality of subsets. In the example depicted in FIG. 5, the indicia 50 can be characterized as having a first subset 86 and a second subset 88. The first subset 86 of dummy waveguides 54 extend adjacent to the first side 82 of the indicia 50 of the pattern of interest of the real waveguides 52a and 52b. The second subset 88 of dummy waveguides 54c and 54d extend adjacent to the second side 84 of the pattern of interest, i.e. the indicia 50 of the real waveguides 52a and 52b forming the component. Although indicia 50 of only two dummy waveguides 54 are provided in each of the subsets 86 and 88, it should be understood that this number may vary. For example, 2, 4, 6, 8, or the like dummy waveguides 54 can be provided in the first subset 86, while 2, 4, 6, 8, or the like dummy waveguides 54 can be provided in the second subset 88. It should be understood that in a preferred embodiment, the indicia 50 will have a same number of dummy waveguides 54 represented in each of the first subset 86 and the second subset 88 so as to form symmetrical representations. However, it should be understood that in certain embodiments the number of dummy waveguides 54 represented in each of the first and second subsets 86 and 88 may be different.

Further, to facilitate the design of the first and second photomasks 42 and 44, and to evaluate the geometry and properties of the resulting structures created thereby, computer software code can be utilized to allow a user to construct a virtual representation of the real and dummy waveguides 60 and 62. For example, such a tool can be implemented utilizing Optical Waveguide Mode Suite (OWMS) and Beam propagation solver software available from Apollo Photonics Corp. of Burlington, Ontario, Canada. This software also allows for numeric simulation using a full vector Beam Propagation Method (FV-BPM) (see also, W. P Huang and C. L. Xu, "Simulation of three-dimensional optical waveguides by a full-vector beam propagation method," IEEE J. Selected Topics in Quantum Electronics, vol. 29, pp. 2639-2649, 1993, the entire content of which is hereby incorporated herein by reference.) The FV-BPM takes into account polarization effects including rotation of the optical field.

For example, software code stored on one or more computer readable medium and executed by a suitable processor can be used to provide a user interface to the user (e.g., via a monitor of a computer system) which receives input from the user (e.g., via a keyboard and/or mouse of the computer system). The user can input information into the user interface that defines one or more parameters associated with the intermediate structure or the integrated optical device. The software code can then store the inputted parameters on the one or more computer readable medium and utilize the inputted parameters to generate and display a virtual representation of the intermediate or integrated optical device corresponding to such parameters. Such parameters received from the user can include for example one or more of the following: width, length of shape of the real or dummy waveguides 62, or any other geometric feature or property of the real or dummy waveguides 60 and 62.

As discussed above, in one embodiment, the virtual representation can be used to simulate the geometries and properties associated with the resulting waveguide structure. Further, such a virtual representation can be incorporated into a design application (such as OWMS) which allows the virtual representation to be positioned within a design in combination with other elements to form planar light-wave circuits, such as in the design of chips and/or wafers having a plurality of chips. Such capability allows a waveguide structure 10 designed by the user (or having predetermined parameters) to be evaluated in combination with other elements in an optical circuit and also facilitates the creation of the first and second photomasks 42 and 44.

Figure 7B:
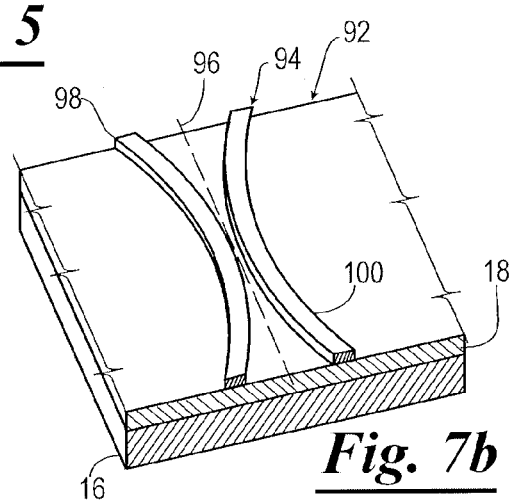
FIG. 7b is a fragmental perspective view of a portion of a planar lightwave circuit constructed in accordance with the present invention having enhanced symmetric optical structures.
Figure 7A:
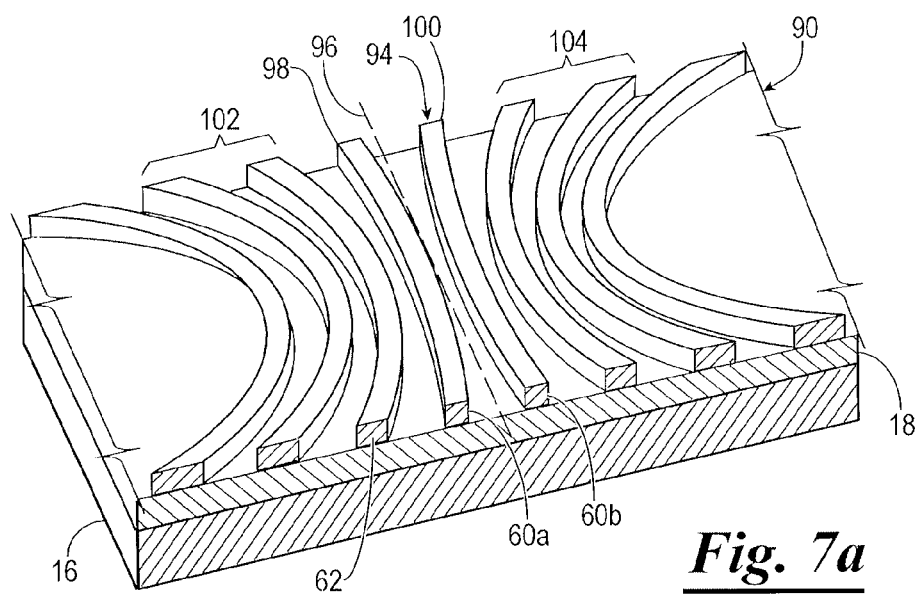
FIG. 7a is a fragmental perspective view of an exemplary intermediate structure constructed in accordance with the present invention that can be used to form an integrated optics device having enhanced symmetric optical structures.

Referring now to FIG. 7a, shown therein is a fragmental, perspective view of an exemplary intermediate structure 90 constructed in accordance with the present invention that can be used to form an integrated optics device 92 (FIG. 7b) having enhanced symmetric optical structures. Shown in FIG. 7b is a fragmental perspective view of a portion of the integrated optics device 92 having a component 94, such as an optical coupler forming a part of a planar lightwave circuit constructed in accordance with the present invention having enhanced optical structures.

The intermediate structure 90 depicted in FIG. 7a is provided with the substrate 16, the cladding 18, and the component 94 (referred to hereinafter as "optical coupler" by way of example) formed of real waveguides 60a and 60b bordered by dummy waveguides 62a-d. The intermediate structure 90 is formed utilizing the first photomask 42 depicted in FIG. 5. The coupler 94 can be bisected as indicated by an axis 96 into symmetric structures, i.e. one symmetric structure formed by the real waveguide 60a and the other symmetric structure formed by the real waveguide 60b. Thus, the optical coupler 94 has a first side 98 and a second side 100 with a first subset 102 of the dummy waveguides 62a-b positioned on the first side 98 of the optical coupler 94, and a second subset 104 of the dummy waveguides 62c-d positioned adjacent to the second side 100 of the optical coupler 94. In a preferred embodiment, the dummy waveguides 62 are formed with an exact cross-sectional structure as the real waveguides 60, and with a space between the dummy waveguides 62 and the real waveguides 60 consistent with the spacing between the real waveguides 60. Thus, when light is introduced into one of the real waveguides 60, such light optically couples with the other real waveguide 60, but unfortunately also optically couples with the dummy waveguides 62.

The integrated optics device 92 depicted in FIG. 7b is similar to the intermediate structure 90 depicted in FIG. 7a, except that the dummy waveguides 62 have been removed so as to not optically couple with the real waveguides 60. The removal of the dummy waveguides 62 will be discussed in detail with reference to FIGS. 13 and 14 below.

Figure 8:
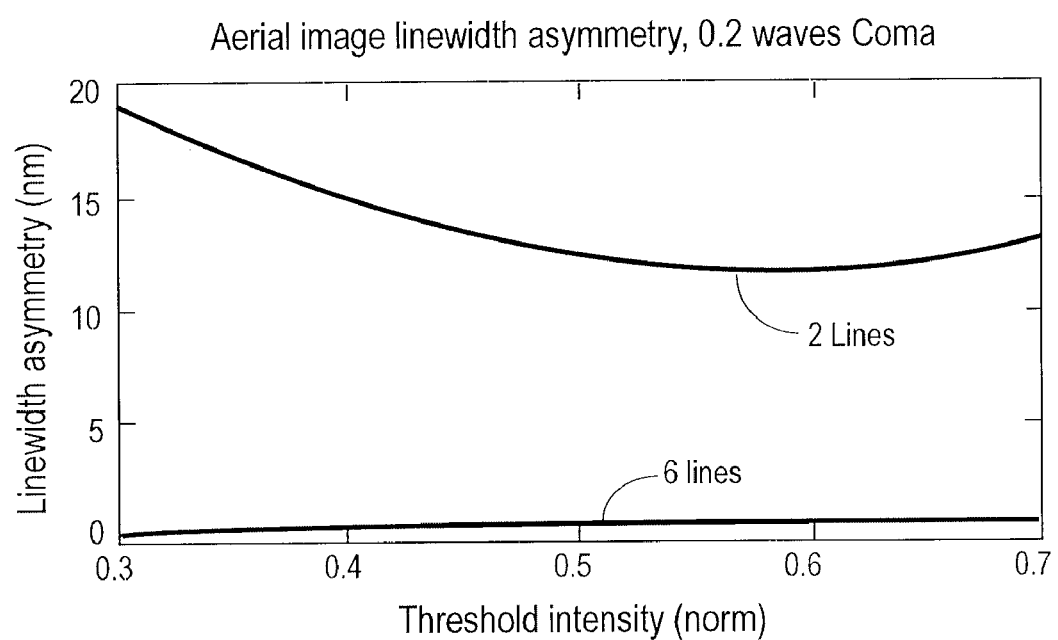
FIG. 8 is an aerial image linewidth asymmetry graph showing the difference in assymmetry from an optical coupler constructed in accordance with the present invention and an optical coupler constructed utilizing prior art methods.

Shown in FIG. 8 is an aerial image line width asymmetry graph showing the difference in asymmetry from an optical coupler constructed in accordance with the present invention having two real waveguides 60 and four dummy waveguides 62, and an optical coupler constructed utilizing prior art methods. The aerial image line width asymmetry graft shows a substantial reduction in the difference in asymmetry from the optical coupler constructed in accordance with present invention and the optical coupler constructed utilizing prior art methods. In fact, simulations have shown over a 20 time improvement in the asymmetry by utilizing the present invention.

Figure 9:
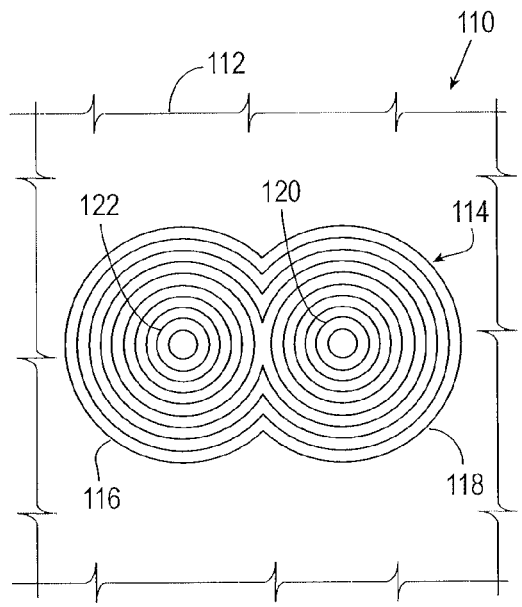
FIGS. 9 and 10 cooperate to illustrate a photomask system used in the production of integrated optical devices in accordance with the present invention. In particular.

Referring now to FIGS. 9-12, shown therein are examples of other photomask systems which can be used in the production of integrated optical devices in accordance with the present invention. In particular, FIGS. 9 and 10 cooperate to illustrate a photomask system 110. FIG. 9 is a fragmental top planview of another version of a first photomask 112 usable in the photolithography system 10 depicted in FIG. 2. In particular, the photomask 112 depicted in FIG. 9 is identical to the first photomask 42 depicted in FIG. 5, with the exception that the photomask 112 is provided with indicia 114 of a pattern of interest being two optical resonators 116 and 118 with dummy waveguides 120 and 122 positioned within the optical resonators so as to more closely form symmetric structures emulating a grating.

Figure 10:
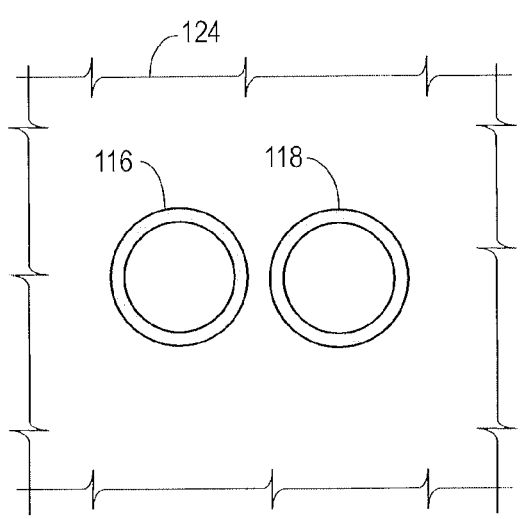

FIG. 10 is a fragmental top planview of another version of a second photomask 124 constructed in accordance with the present invention and usable with the photolithography system 10 depicted in FIG. 2. The second photomask 124 is identical to the first photomask 112, with the exception that the indicia 114 of the dummy waveguides 120 and 122 have been removed.

Figure 11:
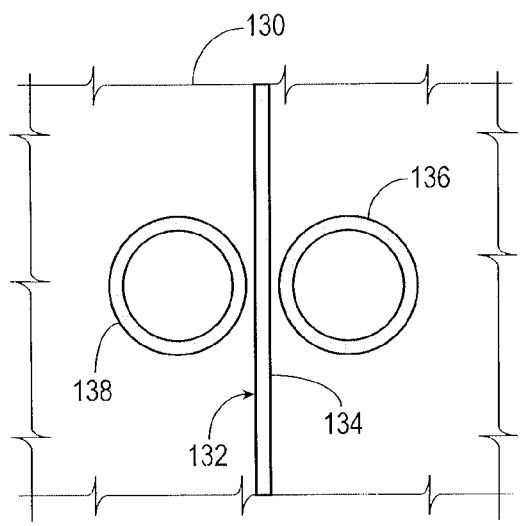
FIGS. 11 and 12 cooperate to illustrate a photomask system used in the production of integrated optical devices in accordance with the present invention. In particular.
Figure 12:
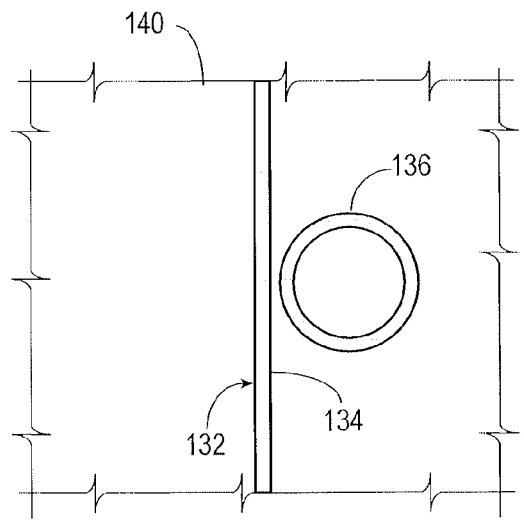

FIG. 11 is another example of a first photomask 130 depicting a pattern of interest having indicia 132 of a pattern of interest, i.e. a linear waveguide 134 adjacent to a coupled resonator 136 bordered by a dummy waveguide 138 to form a representation of a symmetrical structure. Depicted in FIG. 12 is a second photomask 140 which is constructed in a similar manner as the first photomask 130, except that indicia 132 of the dummy waveguide 138 have been removed.

Figure 13:
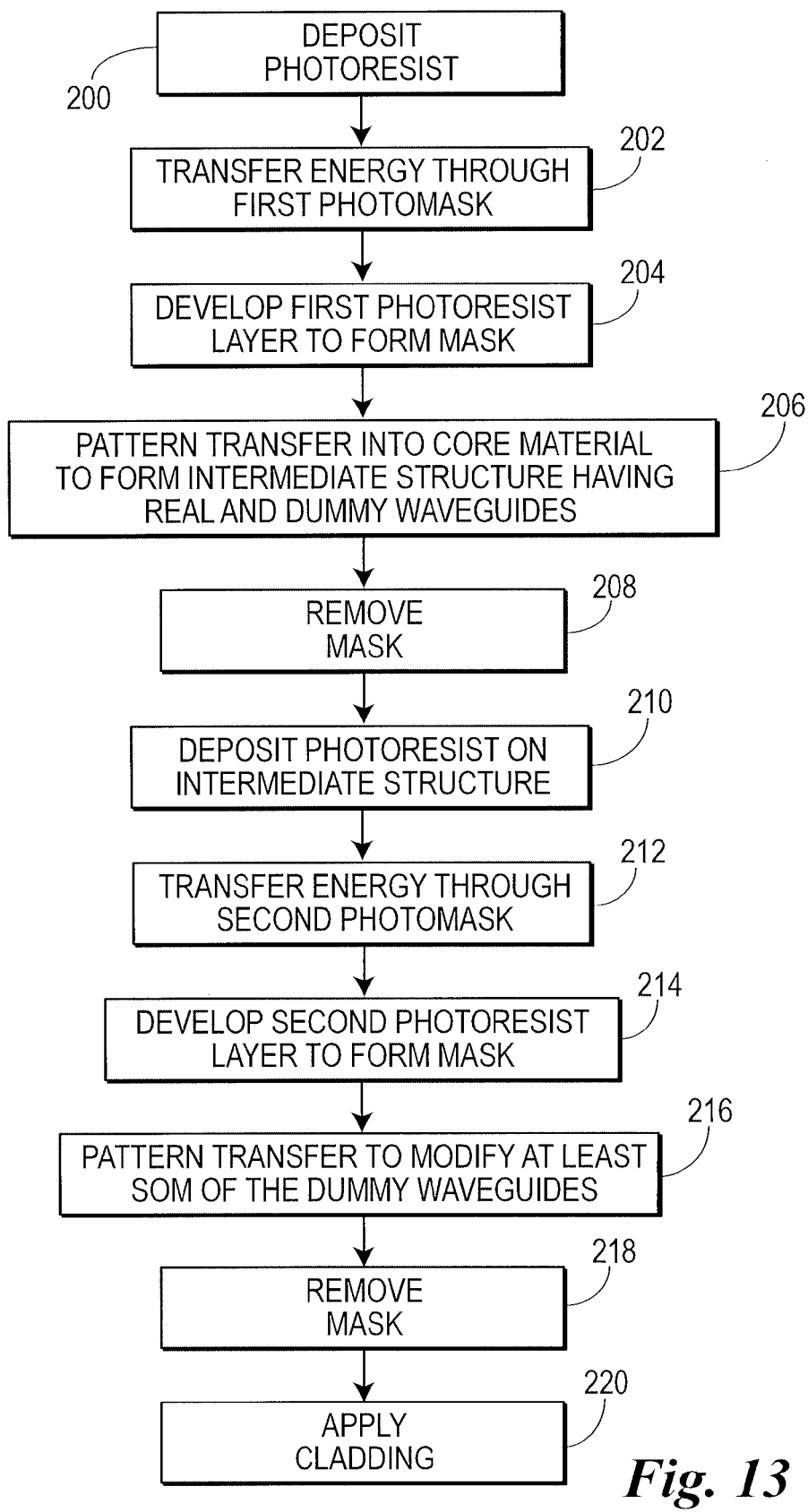
FIG. 13 is a flow chart illustrating one method of forming the integrated optics device having enhanced symmetric optical structures.
Figure 14:
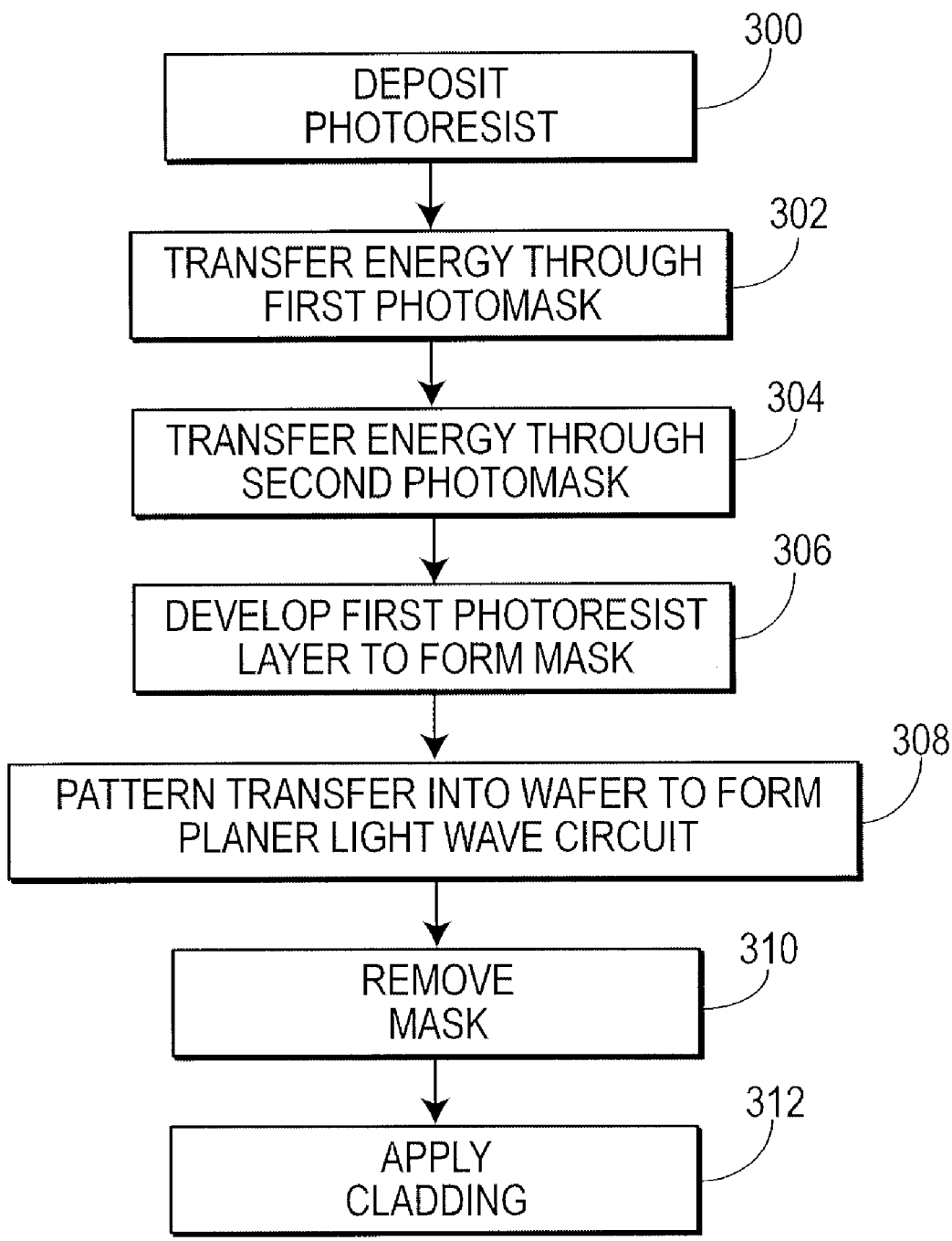
FIG. 14 is a flow chart illustrating another method of forming the integrated optics device having enhanced symmetric optical structures.

Referring to FIGS. 13 and 14, at least two possible ways to remove or modify the dummy waveguides 62 are described.

1. "Etched Removal"

Shown in FIG. 13 is a flow chart illustrating one method for fabricating a planar lightwave circuit of the integrated optics device 92. Initially, a first photoresist layer 20 is applied to the core material 14 as indicated by a block 200. The first photoresist layer 20 can be applied using any suitable process, such as spin coating. Then, energy is transferred through the translucent plate of the first photomask 42 onto the first photoresist layer 20 on the core material 14 as indicated by a block 202. The first photomask 42 has the image 48 of indicia 50 in a predetermined pattern indicative of the at least one real waveguide 52 and at least one dummy waveguide 54.

The first photoresist layer 20 is then developed to form a mask having the predetermined pattern of the real waveguides 52 and the dummy waveguides 54 as indicated by a block 204.

Then, as indicated by a block 206, the predetermined pattern of the real waveguides 52 and dummy waveguides 54 is transferred into the core material 14 to form the intermediate structure 90 having the real and dummy waveguides 60 and 62. The real and dummy waveguides 60 and 62 are situated so as to optically couple upon light being introduced into one of the real waveguides 60. The mask is then removed as indicated by a block 208.

The at least one dummy waveguide 62 adjacent to the real waveguide 60 is then modified to prevent the at least one dummy waveguide 62 from optically coupling with the real waveguide 60 upon light being introduced into the real waveguide 60. This can be accomplished by way of several methods, such as changing the optical characteristics of the real or dummy waveguide(s) 60 or 62, such as by doping or heating. In a preferred embodiment, the dummy waveguides 62 are partially or fully removed from the intermediate structure 90 to prevent light from coupling from the real waveguides 60 to the dummy waveguides 62

To partially or fully remove the dummy waveguides 62, a second photoresist layer is applied to the intermediate structure 90 as indicated by a block 210. Then (as indicated by a block 212), electromagnetic energy is transferred through the translucent plate 70 of the second photomask 44 onto the second photoresist layer on the core material 14. The second photoresist layer is developed (as indicated by a block 214) to form a mask exposing at least the dummy waveguides 62 which are capable of coupling with the real waveguides 60 and the predetermined pattern is transferred into the core material 14 to remove at least a portion of the dummy waveguides 62 as indicated by a block 216.

It should be understood that not all of the dummy waveguides 62 need to be removed. Dummy waveguides 62 that are spaced a distance from the real waveguides 60 where such dummy waveguides 62 will not optically couple with the real waveguides 60 may be left to form a fill material helpful in subsequent planarization steps. The distance can vary depending upon the material used in forming the core material 14, but any dummy waveguides 62 spaced more than approximately 5-10 microns from the real waveguides 60 can remain as fill material. The mask is then removed and another cladding can be applied if desired as indicated by blocks 218 and 220.

Thus, in this approach, the dummy and real waveguides 62 and 60, are grown, patterned and etched with the first photomask 42. The symmetrizing dummy waveguides 62 and spaces adjacent to the main pattern, i.e., the real waveguides 60 are present. Afterward, a second patterning is performed using the second photomask 44 aligned to the prior waveguide pattern. This second pattern protects the real waveguides 60, but leaves the symmetrizing lines exposed to processing. The core material 14 is then etched, so as to remove the symmetrizing dummy waveguides 62. After the second mask is removed, the wafer processing can continue as usual.

It should be noted that the second process does not etch optically active structures in the resulting waveguide circuit, as the pattern edges can fall within the spaces between the pattern lines. This makes the process tolerant to misalignment. In order to perform this process with high quality, it is beneficial for the surface of the core material 14 to be reasonably planar before performing photolithography, and for the trench regions around the real and dummy waveguides 60 and 62 to be protected. One means to accomplish this is through the use of temporary planarization. In this process, the patterned wafer is spin-coated with a suitable planarizing material. The planarizing material is then etched back with a uniform blanket etch that etches the planarizing material much faster than the waveguide material forming the real and dummy waveguides 60 and 62. The etching is stopped when the waveguide cores protrude slightly above the planarizing material surface. The planarizing material is chosen such that it will support the photolithography process and subsequent etch, but can be cleanly stripped at the end of the process. One such material is pyrolyzed photoresist.

The etch process as described above is also tolerant to variation in etch depth. The key factor is that sufficient core material in the adjacent symmetrizing structures (e.g., dummy waveguides 62) be removed to avoid significant optical coupling. Moderate overetch beyond the required depth has little or no effect on subsequent device processing or performance. As the etched surfaces created in the removal of the dummy waveguides 62 are not optically active, the device is relatively insensitive to the sidewall profile and smoothness as compared to the requirements of a waveguide etch process.

2. "Photo Knockout"

Another method for fabricating a planar lightwave circuit of the integrated optics device 92 is shown in FIG. 14. In this method, a first photoresist layer 20 is applied to the core material 14 as indicated by a block 300. The first photoresist layer 20 can be applied using any suitable process, such as spin coating. Then, energy is transferred through the translucent plate 46 of the first photomask 42 onto the first photoresist layer 20 on the core material 14 as indicated by a block 302. The first photomask 42 has the image 48 of indicia 50 in a predetermined pattern indicative of the at least one real waveguide 52 and the at least one dummy waveguide 54 to form an image in the photoresist layer 20 on the core material 14 having a predetermined pattern indicative of the at least one real waveguide 52 and the at least one dummy waveguide 54. Then, the at least one dummy waveguide 54 is removed from the image in the photoresist layer 20 prior to the step of transferring the pattern from the photoresist layer 20 into the core material 14. This can be accomplished in several manners, such as by using the second photomask 44 in the photolithography system 10 to transfer energy through the second photomask 44 to overexpose the portions of the photoresist layer 20 where the images of the dummy waveguides 54 reside as indicated by a block 304. Then, the photoresist layer 20 can be developed to form the mask having the predetermined pattern of the real waveguides 52 followed by transferring the predetermined pattern of the real waveguides 52 into the core material 14 to form the real waveguides 60 as indicated by blocks 306 and 308.

Thus, this process begins with waveguide growth. The photo-patterning process occurs in two steps (here we assume positive photoresist, where exposed resist develops away). In one step, the resist is exposed with the complete pattern including the main pattern and the symmetrizing dummy waveguides and spaces. In this way the symmetric aerial image pattern is created in the photoresist layer 20. All of the symmetrizing features need to be present during this exposure, as the aerial image is in effect a complex interference pattern and the symmetrizing features must participate in the interference. In another exposure step, the second pattern is exposed around the main waveguide pattern. This second pattern exposes the symmetrizing features that are not exposed in the main exposure. The photoresist is then developed. The images of the dummy waveguides will then develop away, leaving behind the main patterns of real waveguides. It may also be possible to perform a variant of this process in which a development step is performed between the two exposure steps. After the entire photo process is completed, the remainder of the standard waveguide process is carried out such as removing the mask and applying cladding as indicated by blocks 310 and 312.

This second process has the virtue of process simplicity relative to the first process discussed above with reference to FIG. 13. All of the steps occur in the photolithography process itself. The sequence is thus transparent to the rest of the fabrication process sequence, with minimal change to the rest of the process flow. As the second patterns are located in close proximity to the critical coupler region, there are likely to be proximity effects on the profile and critical dimension of the coupler pattern. Care must be taken in the design of the main patterns and second patterns, the exposure doses, placement and other photolithography parameters to ensure that the optical components, such as symmetric couplers, created by this process achieve the desired coupling strength.

It will be understood from the foregoing description that various modifications and changes may be made in the preferred and alternative embodiments of the present invention without departing from its true spirit. This description is intended for purposes of illustration only and should not be construed in a limiting sense. The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

What is claimed is:

1. An optical circuit, comprising:
   a substrate;
   a layer provided on the substrate, the layer having a first refractive index;
   an optical coupler provided on the layer, the optical coupler including a first waveguide and a second waveguide, the first and second waveguides being spaced from one another by a distance sufficient to facilitate optical coupling between the first and second waveguides;
   a plurality of third waveguides provided on the layer, the plurality of third waveguides being provided on a first side of the optical coupler; and
   a plurality of fourth waveguides provided on the layer, the plurality of fourth waveguides being provided on a second side of the optical coupler opposite the first side of the optical coupler;
   wherein, each of the first and second waveguides, each of the plurality of third waveguides, and each of the plurality of fourth waveguides have a second refractive index greater than the first refractive index, each of the plurality of third waveguides being spaced from one another and the first and second waveguides, each of the plurality of fourth waveguides being spaced from one another and the first and second waveguides, each of the plurality of third waveguides terminating at corresponding first and second end portions thereof, and each of the plurality of fourth waveguides terminating at corresponding first and second end portions thereof.

2. An optical circuit, comprising:
   a substrate;
   a layer provided on the substrate, the layer having a first refractive index;
   a plurality of first waveguides provided on the layer, each of the plurality of first waveguides being circular and concentric about a first point, each of the plurality of first waveguides having a second refractive index greater than the first refractive index; and
   a plurality of second waveguides provided on the layer, each of the plurality of second waveguides being circular and concentric about a second point, each of the plurality of second waveguides having the second refractive index.

3. The optical circuit of claim 1, wherein each of the plurality of third waveguides is separated from one another by a spacing, and each of the plurality of fourth waveguides is separated from one another by the spacing.

4. The optical circuit of claim 1, wherein each of the plurality of plurality of third waveguides has a first width, and each of the plurality of fourth waveguides has a second width equal to the first width.

5. A photomask, comprising:
a translucent plate having first patterns and second patterns provided thereon for transfer to a photoresist layer on a wafer, the first patterns corresponding to real waveguides on the wafer and the second patterns corresponding to dummy waveguides on the wafer, a spacing between one of the first patterns and one of the second patterns corresponding to a spacing between one of the real waveguides and one of the dummy waveguides, the spacing between said one of the real waveguides and said one of the dummy waveguides being sufficient to facilitate optical coupling between said one of the real waveguides and said one of the dummy waveguides.

6. A photomask system, comprising:
a first photomask comprising a first translucent plate having first patterns and second patterns formed thereon for transfer to a first photoresist layer on a wafer, the first patterns corresponding to real waveguides provided on the wafer and the second patterns corresponding to dummy waveguides provided on the wafer, a spacing between one of the first patterns and one of the second patterns corresponding to a spacing between one of the real waveguides and one of the dummy waveguides, the spacing between said one of the real waveguides and said one of the dummy waveguides being sufficient to facilitate optical coupling between said one of the real waveguides and said one of the dummy waveguides; and
a second photomask comprising a second translucent plate having a third pattern formed thereon for transfer to a second photoresist layer on the wafer, the third pattern including a layer that covers the second patterns when the first and second photomasks are aligned.

7. A method for fabricating a planar lightwave circuit, comprising the steps of:
providing a layer on a substrate, the layer having a first refractive index;
forming a real waveguide and a dummy waveguide on the layer, the real and dummy waveguides having a second refractive index greater than the first refractive index, a distance between the real waveguide and the dummy waveguide being sufficient to facilitate optical coupling between the dummy waveguide and the real waveguide; and
modifying the dummy waveguide to prevent the optical coupling between the dummy and real waveguides.

8. The method of claim 7, wherein the step of forming the real and dummy waveguides further comprises:

depositing a first layer on a second layer, the first layer having a first refractive index and the second layer having a second refractive index less than the first refractive index;
providing a photoresist layer on the first layer;
transferring electromagnetic energy through a translucent plate of a photomask onto the photoresist layer, the photomask having a pattern corresponding to the real waveguide and the dummy waveguide;
developing the photoresist layer to selectively remove portions of the photoresist layer; and
etching portions of the first layer.

9. The method of claim 7, wherein the photoresist layer is a first photoresist layer, the photomask is a first photomask, the translucent plate is a first translucent plate, and the electromagnetic energy is first electromagnetic energy, the step of modifying the dummy waveguide further includes the steps of:
depositing a second photoresist layer on the etched first layer;
transferring second electromagnetic energy through a second translucent plate including a second photomask onto the second photoresist layer, the second photomask including a third layer that covers the real waveguide;
developing the second photoresist layer to form a mask exposing the dummy waveguide; and
etching a portion of the dummy waveguide.

10. The method of claim 9, wherein the mask also covers the real waveguide.

11. A method for fabricating a planar lightwave circuit, comprising the steps of:
providing a first layer on a second layer, the first layer having a higher refractive index than the first layer;
providing a photoresist layer on the first layer;
projecting an image onto the photoresist layer, the image including a first pattern corresponding to a dummy waveguide and a second pattern corresponding to a real waveguide removing the first pattern from the image;
developing the photoresist layer to define a photoresist pattern corresponding to the real waveguide;
etching the first layer to form the real waveguide.

12. An optical circuit in accordance with claim 1, wherein each of the plurality of third waveguides is separated from one another by a spacing, and each of the plurality of fourth waveguides is separated from one another by the spacing.

13. An optical circuit in accordance with claim 1, wherein the optical coupling is a first optical coupling and the distance is a first distance, a second distance between the first waveguide and one of the plurality of third waveguides is sufficient to facilitate second optical coupling between the first waveguide and said one of the plurality of third waveguides, and a third distance between the second waveguide and one of the plurality of fourth waveguides is sufficient to facilitate optical coupling between the second waveguide and said one of the fourth plurality of waveguides.

* * * * *